US006335255B1

(12) United States Patent
Evaldsson et al.

(10) Patent No.: US 6,335,255 B1
(45) Date of Patent: *Jan. 1, 2002

(54) MANUFACTURING A HETEROBIPOLAR TRANSISTOR AND A LASER DIODE ON THE SAME SUBSTRATE

(75) Inventors: Patrik Evaldsson, Sollentuna; Urban Eriksson, Stockholm, both of (SE)

(73) Assignee: Telefonaktiebolaget LM Ericsson (publ), Stockholm (SE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/019,971

(22) Filed: Feb. 6, 1998

(30) Foreign Application Priority Data

Feb. 7, 1997 (SE) .............................. 9700432

(51) Int. Cl.[7] .......................................... H01L 21/331
(52) U.S. Cl. ...................... 438/314; 438/22; 438/312
(58) Field of Search .............................. 438/FOR 289, 438/309, 312, 314, 336, 364, 369, 376, 22; 117/44; 372/7, 45, 50; 257/565, 577, 197

(56) References Cited

U.S. PATENT DOCUMENTS

| 5,059,551 A | * 10/1991 | Chevallier et al. | ........... 438/507 |
|---|---|---|---|
| 5,068,870 A | * 11/1991 | Yagi et al. | ..................... 372/50 |
| 5,106,764 A | * 4/1992 | Harriott et al. | ............. 438/694 |
| 5,108,948 A | * 4/1992 | Murakami et al. | ............ 438/36 |
| 5,122,478 A | * 6/1992 | Uesugi | |
| 5,164,797 A | * 11/1992 | Thorton | ........................ 372/45 |
| 5,181,085 A | * 1/1993 | Moon et al. | .................. 257/94 |
| 5,202,896 A | * 4/1993 | Taylor | ........................ 372/50 |
| 5,239,550 A | * 8/1993 | Jain | ............................. 372/45 |
| 5,283,447 A | * 2/1994 | Olbright et al. | ............... 257/85 |
| 5,414,282 A | * 5/1995 | Ogura | ........................ 257/187 |

OTHER PUBLICATIONS

Liou et al.; A 5Gb/s Monolithically Integrated Lightwave Transmitter with 1.5 micron Multiple Quantum Well Laser and HBT Driver Circuit, IEEE Photonics Technology Letters vol. 3, No. 10, Oct. 1991, pp. 928–929.*

Slater Jr. et al.; Monolithically Integrated SQW Laser and HBT Driver Via Selective OM/VPE Regrowth, IEEE Photonics Technology Letters vol. 5, No. 7, Jul. 1993, pp. 791–794.*

Eriksson et al.; Vertical Integration of an InGaAs/InP HBT and a 1.55 Micron Strained MQW P–Substrate Laser, IEE Proc.–Optoelectron., vol. 143, No. 1, Feb. 1996, pp. 107–109.*

(List continued on next page.)

Primary Examiner—John F. Niebling
Assistant Examiner—Christopher Lattin
(74) Attorney, Agent, or Firm—Burns, Doane, Swecker & Mathis, L.L.P.

(57) ABSTRACT

A heterobipolar transistor HBT and a laser diode LD are manufactured from a common epitaxial structure having a plurality of semiconducting layers. The transistor can be manufactured directly from the material as it is after finishing the epitaxial steps. For manufacturing the laser diode the structure is changed by diffusing zinc into the material, so that the topmost material layers change their dopant type from n-type to p-type. This is made on selected areas of a wafer, so that transistors and laser diodes thereby can be monolithically integrated. The active region of the laser is located in the collector of the transistor, which gives a freedom in designing the components and results in that an individual optimization of the two components can be made. The laser and the HBT can thus be given substantially the same structures, as if they had been individually optimized. The laser will for example be the type vertical injection and can therefor get the same performance as discrete lasers.

29 Claims, 4 Drawing Sheets

Schematic cross-section of a HBT fabricated from the common epitaxial structure

Schematic cross-section of a laser fabricated from the common epitaxial structure

OTHER PUBLICATIONS

Eriksson et al.; Fabrication of a 1.55 micron VCSEL and a InGaAs–InP HBT froma Common Epitaxial Structure, IEEE Photonics Technology Letters vol. 10, No. 4, Apr. 1999, pp. 403–405.*

Eriksson et al., "1.55 µm multiple quantum well laser and heterojunction bipolar transistor fabricated from the same structure utilizing zinc diffusion", SPIE vol. 3006, Opto-electronic Integrated Circuits, Feb. 8, 1997, pp. 145–152, SPIE, Bellingham, Washington.

Bar–Chaim, N., et al., "Monolithic Integration of a GaAlAs buried–heterostructure laser and a polar phototransistor," Appl. Phys., Lett. v.40(7), p556–557 (Apr. 1982).

Goyal, A.K., et al., "A single epitaxial structure for the integration of lasers with HBTs," SPIE, v2148, p359–366 ((1994).

Katz, J., et al., "A monolithic integration of GaAs/GaAlAs bipolar transistor and heterostructure laser," Appl. Phys., Lett. v.37(2), p211–213 (Jul. 1980).

Li, X., et al., "Novel Approach for Integration of an AlGaAs/GaAs Heterojunction Biopolar Transistor with an InGaAs Quantum Well Laser," SPIE, v3006, p126–133 (Feb. 1997).

Shibata, Jun, et al., "Monolithic Integration of InGaAsP/InP Laser Diode with Heterojunction Biopolar Transistors," Extended abstracts/Conference on solid State Devices and Materials, v.m, p129–132 (Aug. 1984).

* cited by examiner

Common epitaxial sequence of layers

Conversion of doping type by means of zinc diffusion

Schematic cross-section of a HBT fabricated from the common epitaxial structure

Schematic cross-section of a laser fabricated from the common epitaxial structure

MANUFACTURING A HETEROBIPOLAR TRANSISTOR AND A LASER DIODE ON THE SAME SUBSTRATE

The present invention relates to manufacturing a heterobipolar transistor and a laser diode on or from the same substrate and it also relates to substrates suitable for such manufacturing. The present invention is also disclosed in the article U. Eriksson, P. Evaldsson, B. Stålnacke, B. Willén, "1.55 μm multiple quantum will laser and heterojunction bipolar transistor fabricated from the same structure utilizing zinc diffusion", SPIE Vol. 3006, pp. 145–152, 1997, which is included by reference herein.

BACKGROUND

The research in the field of monolithic (i.e. arranged on or in the same chip or circuit plate) optoelectronic integrated circuits (OEICs) started in the end of the seventies at CALTECH, USA, see the article by C. P. Lee, S. Margalit, I. Ury and A. Yariv, "Integration of an injection laser with a Gunn oscillator on a semi-insulating GaAs substrate", Appl. Phys. Lett., Vol. 32, No. 12., pp. 806–807, June 1978. The reason thereof was the same as in developing electrical integrated silicon circuits, i.e. it is desired to manufacture both optical components such as lasers, waveguides, detectors on the same substrate as transistors, so that it could be possible to produce chips in large volumes and at low costs. Monolithic integration also reduces the number of chips what allows that more functionality can be packed into a circuit board, on which different chips are conventionally mounted. It can also increase the reliability of a system since fewer external connections are required. It should be added here that a condition for achieving these advantages is that the performance of the various components is not degraded when being integrated, compared to the case where they are manufactured separately. The interest of finding a good solution to the problem how to combine optical and electronic components on the same chip nowadays emanates not only from the technical side but also from the system side. In order to be able to build the optical networks of tomorrow, e.g. extending even into homes, less costly solutions are required, what in turn poses large demands on the technical development.

A large number of different alternative ways exist of achieving monolithic integration. It depends partly on the choice of wavelength and thereby the semiconductor base material which is to be used, such as whether to select either gallium arsenide or indium phosphide, and the choice of electric components such as whether a heterobipolar transistor (HBT) or a field effect transistor (FET) is to be used, and further the choice of optical component, which is desired, such as a photodetector, laser or modulator, partly also on the way in which the very integration is made. It is common to divide the methods used for integration in three classes:

1. Vertical integration. Two or more structures each including an electrical or optoelectrical component are formed sequentially on top of each other.
2. Horizontal integration. Two or more structures each including a component are formed side by side. First the different layers are formed for producing a component and then these are etched away on selected portions of the chip at the side of the manufactured component. The next component is then grown on areas at which material has been etched away.
3. Using the same basic structure for the two components. A basic layer structure is formed, which by further processing including for example etching for defining individual components and only including applying layers for electrical contacts but no other layers results in components of various kinds isolated from each other.

The methods 1. and 2. have the advantage that in principle the individual manufactured components can be optimized. The disadvantage is that the methods of manufacture often will be very complex including a very large number of processing steps. The method 3. results in a simpler manufacturing process but also, most often a compromise must be made as to the performance of the different components to be manufactured.

A method which has often been mentioned in the literature is, to pass, for the laser, from vertical injection to lateral injection and such a laser is called an LCI-laser ("Lateral Current Injection Laser"). Then the different n- and p-doped layers are defined by means of diffusion or implantation, which is made selectively on different portions of a substrate surface, and thereby both lasers and transistors can be produced from the same substrate or chip. This method has been used for integrating a laser and a FET, see the above cited article by C. P. Lee et al., and of a laser and HBT, see N. Bar-Chaim, Ch. Harder, J. Katz, S. Margalit, A. Yariv, I. Ury, "Monolithic integration of a GaAlAs buried-heterostructure laser and a bipolar phototransistor", Appl. Phys. Lett., 40(7), 556, (1982). A disadvantage of this method is however that the result is a new type of laser and/or transistor. Another concept, which has been used, see T. Fukuzawa, M. Nakamura, M. Hirao, T. Kuroda, and J. Umeda, "Monolithic integration of a GaAlAs injection laser with a Schottky-gate field effect transistor", Appl. Phys. Lett., 36(3), 181, (1980), is to first grow the laser structure and on top thereof an undoped layer, from which a FET can be produced. In order to obtain electrical contact with the top p-layer of the laser one then diffuses a p-doping (in this case zinc) through the undoped layer.

SUMMARY

It is an object of the invention to provide a method, by means of which it is possible to manufacture in a simple way transistors and lasers on the same substrate or chip without degrading the performance of transistors and lasers owing to the common method of manufacture. Thus, the problem solved by the invention is how to manufacture transistors and lasers on the same substrate or chip, so that the performance of the transistors and lasers thus manufactured is substantially equal to that of separately fabricated corresponding components.

When manufacturing transistors and lasers on the same substrate a basic structure is first produced, which has a suitably selected sequence of semiconducting layers arranged on top of each other and in particular the start is a substantially "conventional" HBT-structure. The basic structure is then converted to a laser on some areas of the chip. The laser will thereby be the type vertical injection and will thereby be capable of obtaining the same performance as discrete lasers. The conversion to a laser structure is made by diffusing zinc into the material. The advantage therein is that one obtains substantially the same structure of the laser and HBT, as if they had been individually optimized. Similar structures have been made in GaAs/GaAlAs, see J. Katz, N. Bar-Chaim, P. C. Chen, S. Margalit, I. Ury, D. Wilt, M. Yust, A. Yariv, "A monolithic integration of GaAs/GaAlAs bipolar transistor and heterostructure laser", Appl. Phys. Lett., 37(2), 211, 1980. The method proposed in that paper includes that the active area of the laser is located in the base of the HBT what is a difference compared to the method as proposed herein. In the article A. K. Goyal, M. S. Miller, S. I. Long and D. Leonard, "A single epitaxial structure for the integration of lasers with HBTs", SPIE, Vol. 2148, pp. 359–366, 1994, also monolithic integration in the system GaAs/GaAlAs is used but the active region is instead located in the collector in the same way as in the design described herein, what gives a larger freedom when designing the components and what allows an individual optimization of the two components to be made.

A heterobipolar transistor HBT and a laser diode LD are manufactured from a common epitaxial structure. The transistor is then made directly from this epitaxial structure by only confining, separating, isolating and/or defining it by etching and applying electrical contact layers. The different active layers of the transistor are thus the epitaxial layers formed in the structure. In order to manufacture the laser diode the structure is changed by diffusing zinc into it, so that the topmost material layers change their types of doping from n-type to p-type. This is made in selected areas of a wafer, so that transistors and laser diodes in that way are monolithically integrated. Generally, the opposite change, i.e. from p-doping to n-doping in the upper layers, could also be used.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

A complete understanding of the invention and of the above and other features thereof may be gained from a consideration of the following detailed description of non-limiting embodiments presented hereinbelow with reference to the accompanying drawings, in which.

DETAILED DESCRIPTION

In the following a description will be given of a specific embodiment using specific materials. It is to be understood that other materials having corresponding properties could also be used and in particular the specific doping types could be changed to the opposite doping types, i.e. n- and p-dopings could be replaced by p- and n-dopings respectively.

Figure 1:
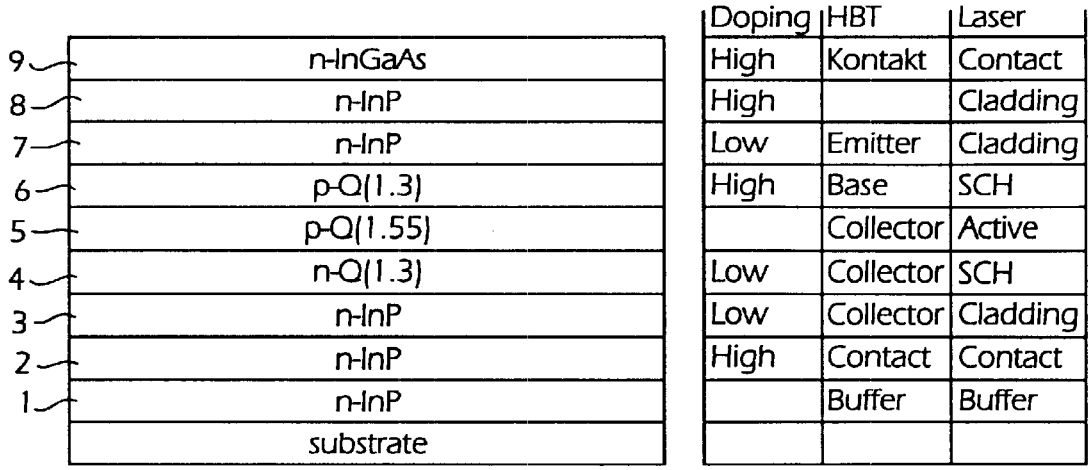
FIG. 1 is a schematic sectional view of a basic sequence of layers arranged on top of each other and suitable for producing a transistor.

In FIG. 1 a schematic sectional view of a common epitaxial sequence of layers is shown which is suited for manufacturing HBTs and laser diodes on the same substrate and which is implemented in a material system based on indium phosphide InP. For simplicity all layers are there illustrated to have the same thickness, whereas when actually producing the structure naturally the layers have different thicknesses depending on their intended operation, material, doping, etc. The epitaxial structure is grown by means of metalorganic vapor phase epitaxy MOVPE or by means of some similar method, by means of which a good control both of layer thicknesses and levels of doping can be obtained. The substrate can be n-InP but it can be more advantageous to use semi-isolating, such as iron doped, InP in order to facilitate monolithic integration of a plurality of transistors and laser diodes, i.e. that a plurality of structures, which operates as transistors or laser diodes can be fabricated on the same chip. The epitaxial structure consists of a number of layers of varying materials, thicknesses and dopings which are p-type or n-type. Generally a material is required having a relatively wide band gap, here InP, a material having a narrower band gap and a higher refractive index, here InGaAsP, having a photoluminescence wavelength $\lambda_{PL}=1.3$ μm and called in short Q(1.3), and an optically active material, here InGaAsP, having a photoluminescence wavelength $\lambda_{PL}=1.55$ μm and called Q(1.55) in short. Moreover, a material having a relatively small band gap can be used for reducing contact resistances, here InGaAs.

The structure consists of, see FIG. 1, a buffer layer 1 of n-InP, a highly doped n-InP-layer 2, a weakly doped n-InP-layer 3, a weakly doped n-Q(1.3) layer 4, un undoped multiple quantum well 5 comprising one or more strained or unstrained quantum wells surrounded by strained or unstrained barriers. The multiple quantum well 5 comprises thus in the preferred case a plurality of relatively thin layers being alternatingly two different types. The whole multiple quantum well is designed to have a net voltage equal to zero, i.e. it is voltage compensated, a highly doped p-Q(1.3) layer 6, a weakly doped n-InP layer 7, a highly doped n-InP layer 8 and at the top a highly doped n-InGaAs layer 9.

The layers 3, 4 and 5 form the collector and the layer 6 the base in the HBT to be manufactured. The heterojunctions exist between the layers 3 and 4 and between the layers 6 and 7. In the laser to be produced the layer 5 forms the active region and the layer 4 and 6 the waveguide portion.

Figure 2:
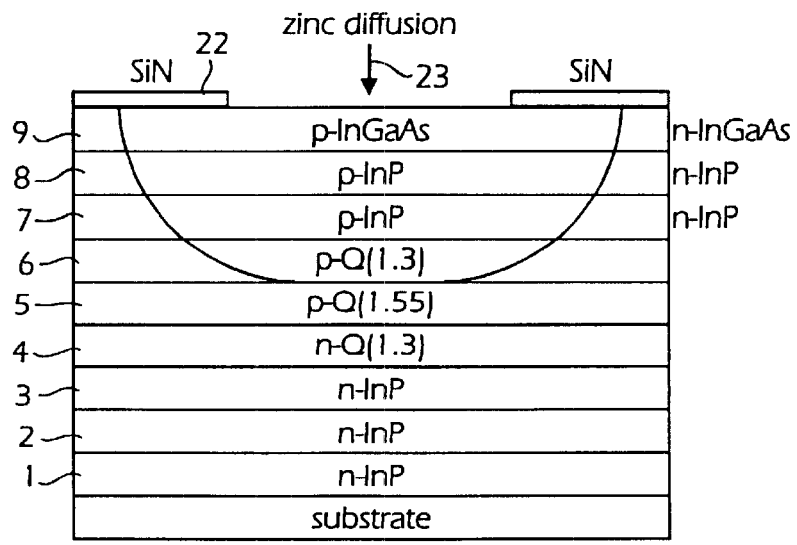
FIG. 2 is a sectional view of the sequence in FIG. 1, which illustrates diffusion of some substance into it in order to produce a structure suitable for a laser.

After producing the epitaxial structure a diffusion processing step is performed for manufacturing a laser diode, see FIG. 2, in which zinc obtained from diethyl zinc (DEZn) in a gaseous shape, or from some other suitable zinc source, is diffused into the material, compare the arrow 23, at a temperature, a pressure and during a time period, which result in a diffusion depth corresponding to at least the layers 7, 8 and 9 in FIG. 1. At those places where zinc has penetrated into the material, it is incorporated in the structure of the material and operates as an acceptor of electrons. For a suitable concentration it will compensate the n-doping in the top layers and an even higher concentration of zinc results in that the material in these layers will be p-doped. In order to select areas on the wafer, in which the diffusion is to be made, the whole wafer is covered with silicon nitride SiN, see the layer 22, and areas in this layer are opened within intended regions by means of lithography in which thus SiN is removed. The areas covered by SiN then remains uninfluenced by the diffusion of zinc, see FIG. 2.

Then is produced, by a combination of dry etching and wet etching of areas selected by means of lithography, a separation or confinement of the structures, which are to operate as HBTs, and those which are to form laser diodes, by producing grooves down to the substrate.

Figure 3:
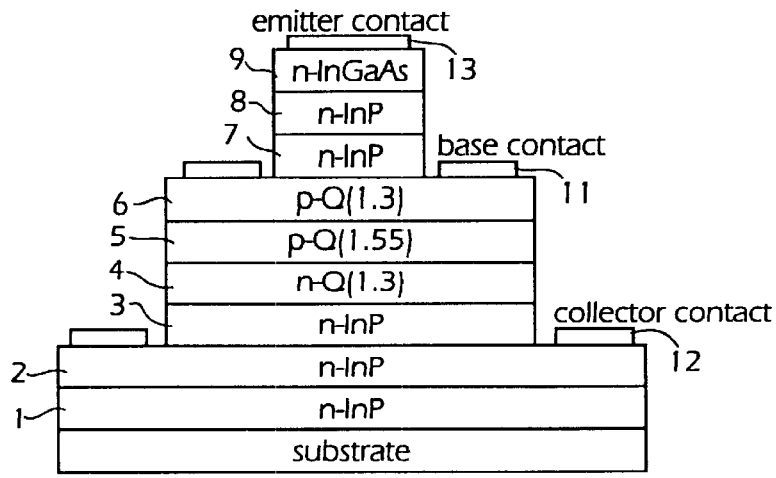
FIG. 3 is a schematic sectional view of a transistor manufactured from the sequence of layers in FIG. 1.

As has appeared above, the HBT is obtained directly by defining laterally the sequence of layers according to FIG. 1. The HBT has a vertical design and has contacts to the collector, the base and the emitter at the respective layer, see FIG. 3. It is confined laterally by a groove having two intermediate steps, one step at the top surface of the layer 2 and one step at the top surface of the layer 6. At these steps the collector contact 12 and the base contact 11 respectively are deposited. The groove which is located outside the collector contact 12 will, as has been indicated above when referring to a confinement laterally of structures, extend into the substrate. The collector contact 12 could for an n-InP-substrate also possibly be located on the under side of the substrate. The emitter contact 13 is located on the exterior surface of the topmost layer. The functions of the different layers are the layer 2 works as a collector contact layer,
the collector is formed by the layers 3–5,
the layer 6 is the base of the transistor,
the emitter is formed by the layer 7,
the layers 8 and 9 are contact layers.

The feature distinguishing this structure from a conventional HBT is that the band gap of the material in the base must be sufficiently large in order not to absorb the light which is emitted from the quantum wells of the laser, in the case where the structure is modified to a laser. This results in that the band gap discontinuity in the valence band between the base and the emitter is reduced. However, it should be added, that one still has a sufficiently high discontinuity, in order not to appreciably affect the current gain of the transistor. A further difference is the existence of a multiple quantum well located in the collector. However, this fact does not influence noticeably the characteristics (non-DC) of the transistor. No apparent differences exist in the operation of a component designed in the way described above, and a conventional HBT of high performance type.

Figure 4:
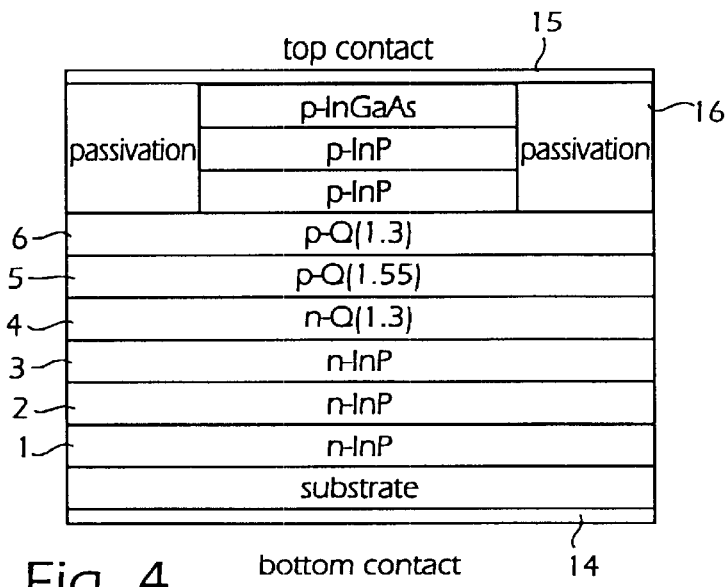
FIG. 4 is a schematic sectional view of a laser manufactured from the basic sequence of layers in FIG. 1 modified according to FIG. 2.

The structure, which is produced by means of the diffusion process described with reference to FIG. 2, results after lateral definition and producing contacting means in a laser diode. A laser diode has an n-contact, which in the case where the substrate is semi-isolating, is identical to and located on the same surface as the collector contact 12. If the substrate is n-InP the contact can be deposited on the under side of the substrate, as is illustrated at 14 in FIG. 4. The laser has a p-contact 15 on top of the topmost layer 9 in the sequence of layers. The operation of the different layers is then, see FIG. 4:

the layers 1–3 constitute the cladding and contact layers,
a lower separate confinement heterostructure ("separate confinement structure") SCH in the layer 4,
the layer 5 is the active region,
an upper separate confinement structure SCH in the layer 6,
the layers 7 and 8 form a cladding,
the layer 9 is a contact layer.

This structure contains all those parts which a conventional quantum well laser of double heterostructure type is to have, and is substantially identical to the standard structures used for advanced lasers for the wavelength 1.55 μm. One difference is the high p-doping, which exists in the top layer of the upper heterostructure and is necessary for the HBT and which could result in degraded performance of the laser. However, for moderate doping levels satisfactorily good results have been obtained and simulations indicate that for an improved design of the structure the level can be even more increased. In the separate heterostructures in the layers 4 and 6 the heterojunctions of the corresponding transistor are located. Both the active region of the laser in the region 5 and the lower n-SCH in the layer 4 are located in the collector region of the corresponding transistor. The layer 6, which forms the upper p-SCH, constitutes the base in the corresponding transistor.

Figure 5:
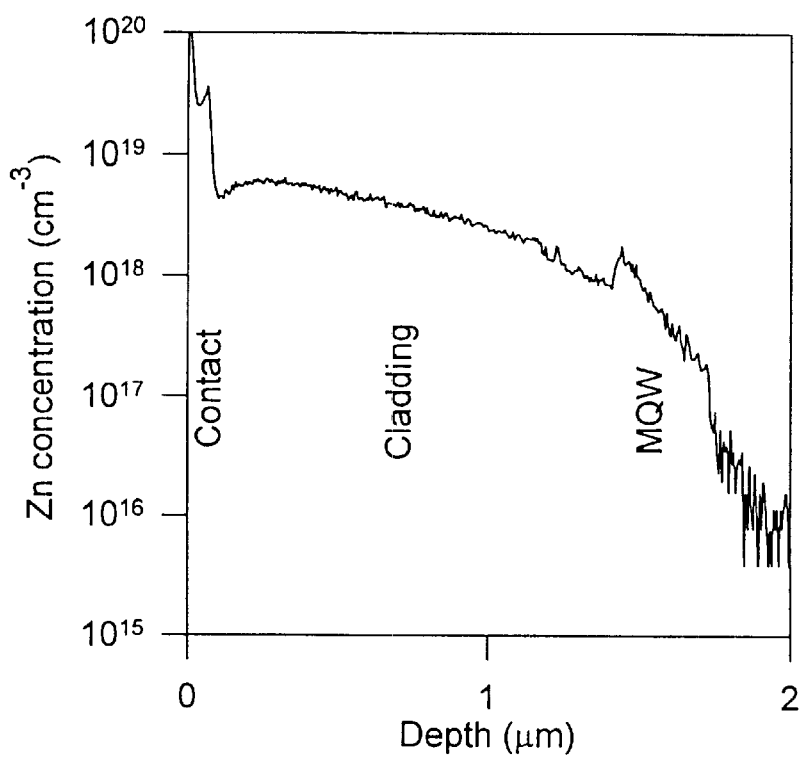
FIG. 5 is a diagram of Zn-concentration as a function of depth beneath the surface of the diffusion according to FIG. 2.

In a practical experiment the epitaxial base structure illustrated in FIG. 1 was produced by means of metalorganic vapor phase epitaxy MOVPE of low pressure type at 680° C. on an n-InP-substrate. Zinc was diffused into the material using DEZn as a source and for an overatmospheric pressure of phosphine $PH_3$ and using hydrogen gas as a carrier gas. The temperature was maintained at 475° C. and the overatmospheric pressure was 100 mbar during 1 h 20 min. A zinc concentration in the InP-layers exceeding $1 \cdot 10^{18}$ was obtained, see the diagram in FIG. 5. The configuration of the produced structures appears from the tables below.

Figure 8:
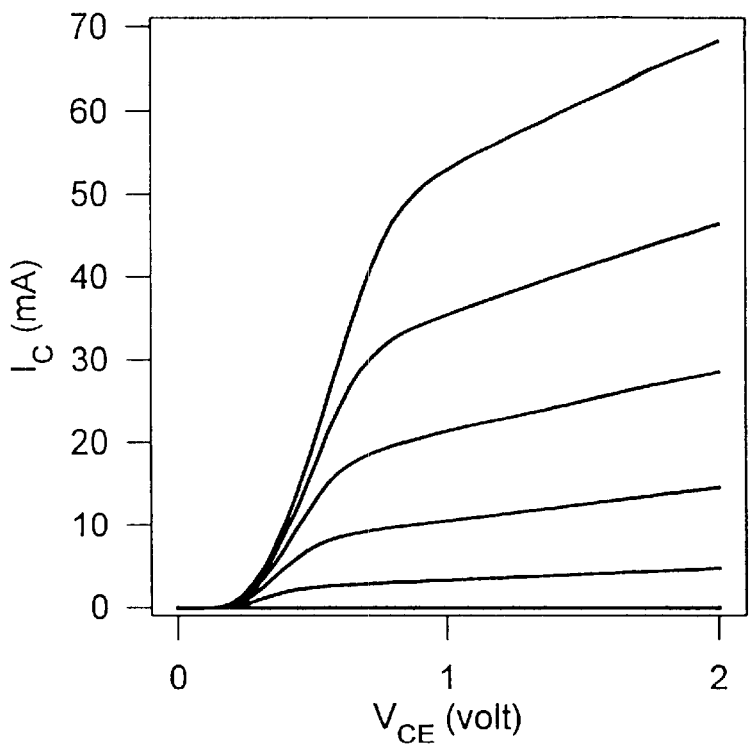
FIG. 8 is a diagram of the measured voltage current $I_{CE}$ between collector and emitter of the transistor according to FIG. 3 connected in a common emitter-coupler circuit as a function of the voltage $V_{CE}$ between the collector and the emitter.

For manufacturing an HBT an emitter contact of Ti/Pt/Au was deposited by evaporation and lift-off of photoresist layer and the metal layer deposited on top thereof in the conventional way and the remaining metal was then used as a mask in etching down to the base layer 6 by means of reactive ion etching (RIE) in a plasma including hydrogen gas and methane followed by a selective wet etching based on $HCl:H_2O$. Then a base contact of Pt/Ti/Pt/Au was applied in the same way as the emitter contact. A silicon nitride mask was defined and covered the base and the emitter contacts. By means of dry etching portions of the base and collector layers were removed around the central structure for forming substantially structures according to FIG. 3. The collector contact was deposited on the underside of the substrate by evaporating Ni/AuGe. In FIG. 8 the measured current $I_{CE}$ from collector to emitter is illustrated for the obtained transistor connected in a common emitter circuit as a function of the voltage $V_{CE}$ between the collector and emitter for the base currents $I_B=0, 20, 40, \ldots, 100$ μA.

Figure 9:
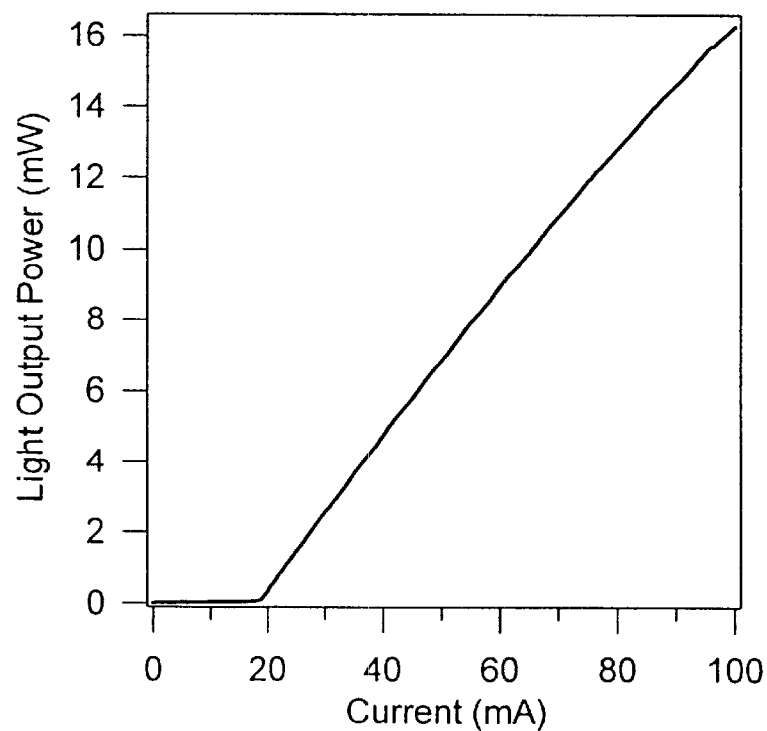
FIG. 9 is a diagram of the light power provided by the laser according to FIG. 4 as a function of the electric current.

The manufacture of a laser diode of ridge type from the base structure started by patterning stripes having a width of 3 μm on the top surface in order to confine the laser structure and then a top contact was applied to the top surface in the same way as the emitter contact above. The metal contact was then used as a mask in dry etching down to the p-cladding of the laser. Selective wet etching was used down to the etch stop layer in order to complete the ridge structure of the laser. For passivating and planarizing purposes then an 1.5 μm thick silicon nitride layer was deposited by means of PECVD (Plasma Enhanced Chemical Vapor Deposition, compare the passivating regions 16 in FIG. 4). The wafer was polished down to a thickness of about 120 μm and a bottom contact of AuGe/Ni/Ti/Pt/Au was applied by evaporation. The laser was then divided by splitting it and was mounted on a silicon carrier which served as a heat sink. In FIG. 9 a diagram of the light power provided by the manufactured laser as a function of injected current is illustrated.

TABLE 1

HBT-structure

| Layer | Material | Thickness [nm] | Doping [cm$^{-3}$] |
|---|---|---|---|
| Contact | InGaAs | 50 | n:5 · 10$^{18}$ |
|  | InP | 1300 | n:1 · 10$^{18}$ |
|  | InGaAsP ($\lambda$ = 1,3 $\mu$m) | 2 | n:1 · 10$^{18}$ |
| Emitter | Inp | 200 | n:5 · 10$^{17}$ |
| Distance layer | InGaAsP ($\lambda$ = 1,3 $\mu$m) | 5 | undoped |
| Base | InGaAsP ($\lambda$ = 1,3 $\mu$m) | 80 | p:4 · 10$^{18}$ |
| Collector | 9xInGaAsP-($\lambda$ = 1,3 $\mu$m)-barrier layer, tensile stress 0,9%, | 8 | undoped |
|  | 8xInGaAsP-($\lambda$ = 1,55 $\mu$m)-quantum well layer, compressive stress 1% | 7 | undoped |
| Collector | InGaAsP ($\lambda$ = 1,3 $\mu$m) | 40 | n:1 · 10$^{17}$ |
| Collector | Inp | 200 | n:1 · 10$^{17}$ |
| Subcollector | Inp | 500 | n:1 · 10$^{18}$ |

TABLE 2

Laser diode structure

| Layer | Material | Thickness [nm] | Doping [cm$^{-3}$] |
|---|---|---|---|
| Contact | InGaAs | 50 | p-diff. |
| Cladding | InP | 1300 | p-diff. |
| Etch stop 1. | InGaAsP ($\lambda$ = 1,3 $\mu$m) | 2 | p-diff. |
| Cladding | Inp | 200 | p-diff. |
| p-SCH | InGaAsP ($\lambda$ = 1,3 $\mu$m) | 5 | p-diff. |
| p-SCH | InGaAsP ($\lambda$ = 1,3 $\mu$m) | 80 | p:4 · 10$^{18}$ |
| Active layer | 9xInGaAsP-($\lambda$ = 1,3 $\mu$m)-barrier layer, tensile stress 0,9%, | 8 | undoped |
|  | 8xInGaAsP-($\lambda$ = 1,55 $\mu$m)-quantum well layer, compression stress 1% | 7 | undoped |
| n-SCH | InGaAsP ($\lambda$ = 1,3 $\mu$m) | 40 | n:1 · 10$^{17}$ |
| Cladding | Inp | 200 | n:1 · 10$^{17}$ |
| Cladding | Inp | 500 | n:1 · 10$^{18}$ |

Figure 6:
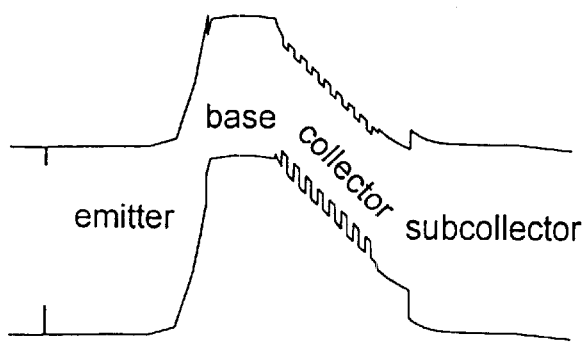
FIG. 6 is a band diagram of the transistor according to FIG. 3 when being in balance.
Figure 7:
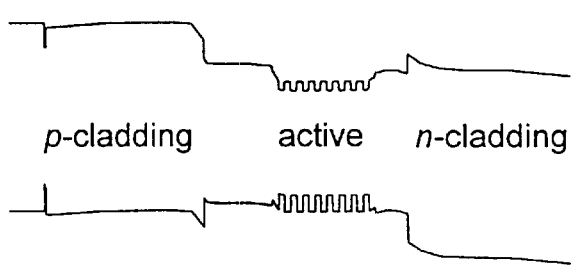
FIG. 7 is a band diagram of a forwardly biased laser according to FIG. 4.

Calculated band diagrams of electrons/holes are illustrated in FIGS. 6 and 7, in which FIG. 6 shows a band diagram of the HBT structure in a balanced state and FIG. 7 shows a band diagram of a laser diode structure being forwardly biased.

Above a laser structure of the edge-emitting type has been described. However, it may also be advantageous to manufacture a surface-emitting laser, this requiring only minor modifications of some processing steps.

Additional advantages and modifications will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents.

What is claimed is:

1. A method of manufacturing a transistor and a laser on the same substrate having a surface, comprising the steps of:
   building a sequence of layers over the surface of the substrate, each of the layers having a consistent composition taken horizontally, and
   selecting the layers in the sequence of layers to be semiconductors and to have such an order and such compositions and such dopings, that the following further steps can be performed:
   confining laterally a first area at the surface of the substrate so that confined layers in the first area form a vertical transistor structure,
   making a substance diffuse into upper layers in a second area of the sequence of layers to change doping types in the upper layers in the second area, the second area being laterally separate and distinct from the first area, and
   confining laterally the second area so that confined layers in the second area form a laser structure.

2. The method of claim 1, wherein the sequence of layers is selected, so that a set of neighboring layers of the sequence of layers forms a quantum well structure or an active region of a laser structure, the laser structure being formed when making the substance diffuse into the second area and confining laterally the second area.

3. The method of claim 1, wherein the sequence of layers is selected, so that when making the substance diffuse into the upper layers of the sequence of layers in the second area a type of doping in the upper layers is changed from n-doping to p-doping or from p-doping to n-doping.

4. The method of claim 1, wherein the sequence of layers is selected, so that a heterojunction is formed in the sequence of layers, whereby, when confining laterally the first area to make layers in the first area form a vertical transistor structure, the vertical transistor structure is a heterobipolar transistor.

5. The method of claim 1, wherein the sequence of layers is selected, so that a heterojunction is formed in the sequence of layers, so that when confining laterally the first area to make layers in the first area form a vertical transistor structure, the vertical transistor structure is a heterobipolar transistor which has a heterojunction located between an emitter and a base of the vertical transistor structure.

6. The method of claim 1, wherein the sequence of layers is selected, so that a heterojunction is formed between a first layer in the sequence of layers and a directly adjacent second layer in the sequence of layers, wherein the first layer in the sequence of layers forms a separate confined heterostructure (SCH) for an active region of the laser structure in the second area.

7. The method of claim 1, wherein the sequence of layers is selected, so that a layer in the sequence of layers that forms a layer of a collector in the vertical transistor structure in the first area also forms a separate confinement heterostructure of n-type (n-SCH) for an active region of the laser structure in the second area.

8. The method of claim 1, wherein the sequence of layers is selected, so that a layer in the sequence of layers that forms a layer of a base in the vertical transistor structure in the first area also forms a separate confinement heterostructure of p-type (p-SCH) for an active region of the laser structure in the second area.

9. The method of claim 1, wherein the sequence of layers comprises a first layer from which is derived a first collector layer of a collector in the vertical transistor structure and from which is derived a first cladding layer in the laser structure.

10. The method of claim 9, wherein the sequence of layers further comprises a second layer from which is derived a second collector layer of the collector in the vertical transistor structure and from which is derived a first waveguide layer in the laser structure.

11. The method of claim 10, wherein the sequence of layers further comprises a third layer from which is derived a third collector layer of the collector in the vertical transistor structure and from which is derived an active region in the laser structure.

12. The method of claim 11, wherein the sequence of layers further comprises a fourth layer from which is derived a layer of a base in the vertical transistor structure and from which is derived a second waveguide layer in the laser structure.

13. The method of claim 12, wherein the sequence of layers further comprises a fifth layer from which is derived a layer of an emitter in the vertical transistor structure and from which is derived a second cladding layer in the laser structure.

14. The method of claim 13, wherein the laser structure is configured as a separate confinement heterostructure (SCH) laser structure.

15. The method of claim 13, wherein the vertical transistor structure is configured as a heterobipolar transistor structure.

16. The method of claim 13, wherein the second layer is disposed between the first and third layers, wherein the third layer is disposed between the second and fourth layers, and wherein the fourth layer is disposed between the third and fifth layers.

17. The method of claim 13, wherein the first and fifth layers comprise InP and wherein the second, third and fourth layers comprise InGaAsP.

18. The method of claim 17, wherein the third layer comprises InGaAsP of a composition having a photoluminescence wavelength of about 1.55 microns and wherein the second and fourth layers comprise InGaAsP of a composition having a photoluminescence wavelength of about 1.3 microns.

19. The method of claim 17, wherein the upper layers include the fourth and fifth layers and wherein the substance diffused into the upper layers comprises zinc.

20. A method of manufacturing a transistor and a laser on the same substrate having a surface, comprising the steps of:
    building a sequence of layers over the surface of the substrate, each of the layers having a consistent composition taken horizontally, and
    selecting the layers in the sequence of layers to be semiconductors and to have such an order and such compositions and such dopings, that the following further steps can be performed:
    confining laterally a first area at the surface of the substrate so that confined layers in the first area form a vertical transistor structure, and
    making a substance diffuse into upper layers in a second area of the sequence of layers to change doping types in the upper layers in the second area, the second area being separate from the first area, and
    confining laterally the second area so that confined layers in the second area form a laser structure, wherein at least one of the upper layers in the second area having its doping type changed forms a cladding layer of the laser structure.

21. A method of manufacturing a transistor and a laser diode on the same substrate having a surface, comprising the steps of:
    building a sequence of semiconductor layers over the surface of the substrate, each of the layers having a consistent composition taken horizontally, and
    selecting the layers in the sequence of layers to include a first group of layers having a first doping type, a second group of layers having second doping type and being disposed adjacent to the first group of layers, and a third group of layers having the first doping type and being disposed adjacent to the second group of layers wherein the following further steps can be performed:
    confining laterally a first area at the surface of the substrate so that confined layers in the first area form a vertical transistor structure, and
    making a substance diffuse into the first group of layers in a second area to change the doping type of the first group of layers in the second area from the first doping type to the second doping type, wherein the overall doping profile of the first, second, and third groups of layers in the second area is changed to that of a diode structure, and
    confining laterally the second area so that confined layers in the second area form a diode laser structure.

22. The method of the claim 21, wherein the first doping type is n-type and wherein the second doping type is p-type.

23. The method of the claim 21, wherein the first doping type is p-type and wherein the second doping type is n-type.

24. The method of claim 1, wherein said step of making a substance diffuse into upper layers in a second area is carried out prior to said step of confining laterally the second area.

25. The method of claim 1, wherein the sequence of layers includes first, second, third, fourth and fifth layers arranged in that order, wherein
    the first and fifth layers comprise InP, the second, third and fourth layers comprise InGaAsP, and a composition of the second layer and a composition of the fourth layer differ from a composition of the third layer.

26. The method of claim 20, wherein said step of making a substance diffuse into upper layers in a second area is carried out prior to said step of confining laterally the second area.

27. The method of claim 20, wherein the sequence of layers includes first, second, third, fourth and fifth layers arranged in that order, wherein the first and fifth layers comprise InP, the second, third and fourth layers comprise InGaAsP, and a composition of the second layer and a composition of the fourth layer differ from a composition of the third layer.

28. The method of claim 21, wherein said step of making a substance diffuse into the first group of layers in a second area is carried out prior to said step of confining laterally the second area.

29. The method of claim 21, wherein the sequence of layers includes in the following order an InP layer in the first group of layers, two InGaAsP layers in the second group of layers, the two lnGaAsP layers having different compositions, an InGaAsP layer in the third group of layers having a composition different from that of at least one of the two InGaAsP layers in the second group of layers, and an InP layer in the third group of layers.

\* \* \* \* \*